United States Patent
Sumita

(10) Patent No.: US 10,050,226 B2
(45) Date of Patent: Aug. 14, 2018

(54) DISPLAY DEVICE AND METHOD OF MANUFACTURING A DISPLAY DEVICE

(71) Applicant: Japan Display Inc., Tokyo (JP)

(72) Inventor: Shiro Sumita, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/260,403

(22) Filed: Sep. 9, 2016

(65) Prior Publication Data
US 2017/0077449 A1   Mar. 16, 2017

(30) Foreign Application Priority Data

Sep. 16, 2015   (JP) .................................. 2015-183450

(51) Int. Cl.
| | |
|---|---|
| *H01L 51/52* | (2006.01) |
| *G09G 3/3208* | (2016.01) |
| *H01L 27/32* | (2006.01) |

(52) U.S. Cl.
CPC ....... *H01L 51/5253* (2013.01); *G09G 3/3208* (2013.01); *G09G 2300/04* (2013.01); *H01L 27/322* (2013.01); *H01L 51/5246* (2013.01)

(58) Field of Classification Search
CPC ............. H01L 51/5253; H01L 51/5246; H01L 51/525; H01L 27/322; H01L 51/56; H01L 51/52; H01L 27/32; G09G 3/3208; G09G 2300/04
See application file for complete search history.

(56) References Cited

U.S. PATENT DOCUMENTS

| | | | |
|---|---|---|---|
| 2002/0030440 A1 | 3/2002 | Yamazaki | |
| 2006/0014465 A1 | 1/2006 | Yamazaki | |
| 2009/0180043 A1* | 7/2009 | Rho | ..................... G02F 1/13338 349/12 |
| 2013/0009181 A1* | 1/2013 | Daishi | ................. H01L 51/5246 257/89 |

FOREIGN PATENT DOCUMENTS

| | | |
|---|---|---|
| JP | 2002-093576 A | 3/2002 |
| JP | 2008-166152 A | 7/2008 |

* cited by examiner

Primary Examiner — Thanh T Nguyen
(74) Attorney, Agent, or Firm — Typha IP LLC

(57) ABSTRACT

A display device provided with a display region composed of a plurality of pixels. The display device includes a first substrate including at least one spacer that is formed so as to surround the display region, and an inorganic film that is formed of an inorganic material and covers at least a top and an outer side surface of the at least one spacer, a second substrate that is disposed opposed to the first substrate and a bonding layer that is disposed inside the at least one spacer, bonds the first substrate and the second substrate with each other, and is made of an organic material.

6 Claims, 14 Drawing Sheets

1401

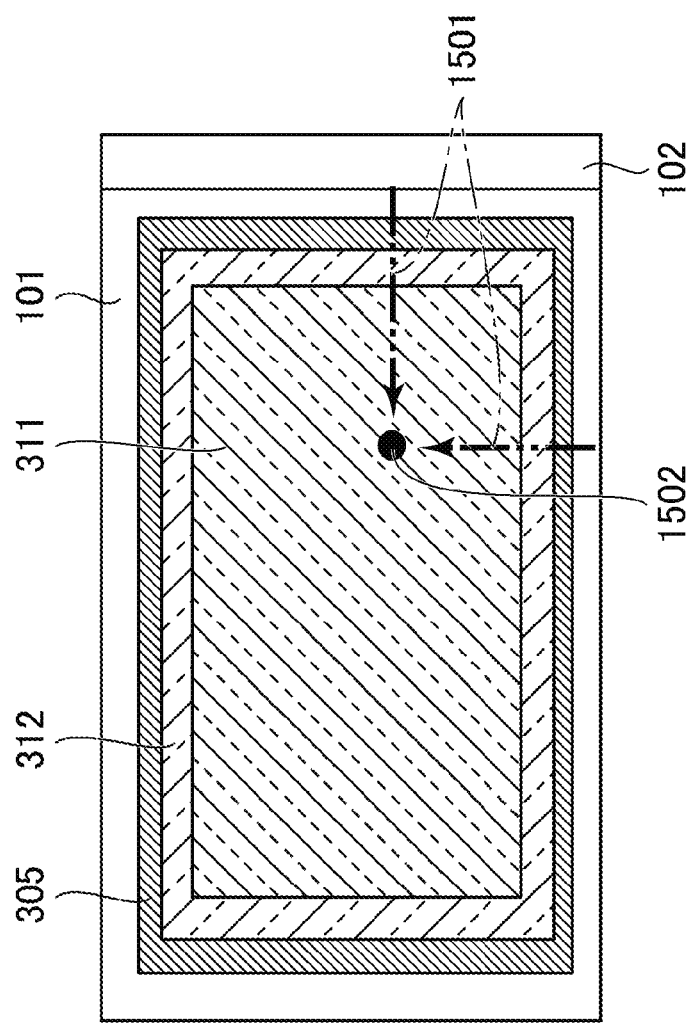

DISPLAY DEVICE AND METHOD OF MANUFACTURING A DISPLAY DEVICE

CROSS-REFERENCE TO RELATED APPLICATION

The present application claims priority from the Japanese Application JP2015-183450 filed on Sep. 16, 2015. The Japanese Application JP2015-183450 is incorporated by reference into this application.

BACK GROUND OF THE INVENTION

1. Field of the Invention

The present invention relates to a display device, and to a method of manufacturing a display device.

2. Description of the Related Art

Recently, display devices such as an organic EL display device using an organic EL (Electro-Luminescent) element, and a liquid crystal display device are put into practical use. However, since an organic EL element is vulnerable to moisture, there is a fear that the organic EL element deteriorates due to moisture and lighting failures such as dark spots occur. Further, on a liquid crystal display as well, there occurs a problem that a characteristic of a thin film transistor changes due to an influence of moisture penetrated therein and display quality degenerates.

FIGS. 15 and 16 are diagrams illustrating, as an example, penetration routes of the above moisture in an organic EL display device. Here, FIG. 15 illustrates a front view of a general organic EL display device and FIG. 16 illustrates a side view. As illustrated in FIGS. 15 and 16 respectively, the organic EL display device is formed by bonding, an array substrate 201, on which a barrier film 305, a cathode electrode layer 304, an organic EL layer 303 and the like are disposed, and a color filter substrate 202, on which color filters and the like are disposed, to each other by a filler such as a fill agent 311 and a dam agent 312. Further, as illustrated in FIGS. 15 and 16, in the case where a pinhole 1502 exists in the barrier film 305 arranged above the organic EL layer 303 and the cathode electrode layer 304, there is a fear that moisture reaches the organic EL element from the lateral side of the display device via the dam agent 312, the fill agent 311, and the pin hole 1502, as a water penetration route 1501 illustrated in FIGS. 15 and 16.

For example, Japanese Patent Application Laid-open No. 2002-93576 discloses preventing moisture from penetrating into a seal agent by further forming a solid carbon film on the surface of the seal agent on an organic EL display device formed by bonding a substrate forming an organic EL element and a cover agent for sealing to each other by the seal agent. Further, for example, Japanese Patent Application Laid-open No. 2008-166152 discloses bonding a substrate, on which an EL element is formed, and a sealing plate to each other by an intermediate layer and further covering the intermediate layer with a sealing layer so that moisture will not penetrate into the inner side, although the intermediate layer is exposed to the outside.

SUMMARY OF THE INVENTION

As in the above prior art documents, in the case where a lateral side of a bonding layer is covered after a process of bonding a substrate forming a display element and a sealing substrate with each other, a load is generated in the process because it is necessary to provide a process to seal the lateral side. Further, in general, another process is performed between a process of bonding panels with each other and a process of sealing a lateral side, and thus, there may be a potential for moisture permeating after the process of bonding the panels to each other and before the process of sealing the lateral side that generates a problem of lighting failures.

The present invention has been made in view of the above described problems, and an object of the present invention is to provide a display device and a method of manufacturing the display device for reducing a load of a manufacturing process and preventing a degeneration of an element due to moisture.

According to one aspect of the present invention, a display device provided with a display region composed of a plurality of pixels. The display device includes a first substrate including at least one spacer that is formed so as to surround the display region, and an inorganic film that is formed of an inorganic material and covers at least a top and an outer side surface of the at least one spacer, a second substrate that is disposed opposed to the first substrate and a bonding layer that is disposed inside the at least one spacer, bonds the first substrate and the second substrate with each other, and is made of an organic material.

In one embodiment of the present invention, the inorganic film extends further to at least a part of an inner side surface of the at least one spacer.

In one embodiment of the present invention, the bonding layer has a fill agent that fills a space between the first substrate and the second substrate, and a dam agent that is less permeable than the fill agent and is disposed outwardly from the fill agent. The dam agent is disposed so as to cover at least a part of a top of the at least one spacer.

In one embodiment of the present invention, the at least one spacer comprises two or more spacers formed extending outwardly from the display region.

In one embodiment of the present invention, a vacuum layer is provided between the two or more spacers.

In one embodiment of the present invention, the first substrate further has a color filter layer that transmits light of a predetermined wavelength, and the at least one spacer is formed of a same material as the color filter layer.

According to an another aspect of the present invention, a method of manufacturing a display device provided with a display region composed of a plurality of pixels. The method includes a step of forming a first substrate including at least one spacer that is formed so as to surround the display region and an inorganic film that is formed at least on a top and an outer side surface of the at least one spacer with an inorganic material, a step of forming a second substrate on which a display element is disposed on the display region, a step of dropping a filler on one of the first substrate and the second substrate and a step of bonding the first substrate and the second substrate to each other by the filler.

In one embodiment of the present invention, the inorganic film extends further to at least a part of an inner side surface of the at least one spacer.

In one embodiment of the present invention, the filler comprises a fill agent that bonds the first substrate and the second substrate with each other and the dam agent that is less permeable than the fill agent and is disposed outwardly from the fill agent. The dam agent is disposed so as to cover at least a part of a top of the at least one spacer.

In one embodiment of the present invention, the at least one spacer comprises two or more spacers formed extending outwardly from the display region.

In one embodiment of the present invention, a vacuum layer is provided between the two or more spacers.

In one embodiment of the present invention, the first substrate further has a color filter layer which transmits a light of a predetermined wavelength. The at least one spacer is formed of a material same with the color filter layer.

BRIEF DESCRIPTION OF THE DRAWINGS

FIG. 15 is an illustration for explaining moisture penetration routes in a conventional technology.

DETAILED DESCRIPTION OF THE INVENTION

Embodiments of the present invention will be described below with reference to the accompanying drawings. The disclosure herein is merely an example, and any modification coming within the spirit of the present invention and obvious to those skilled in the art is intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
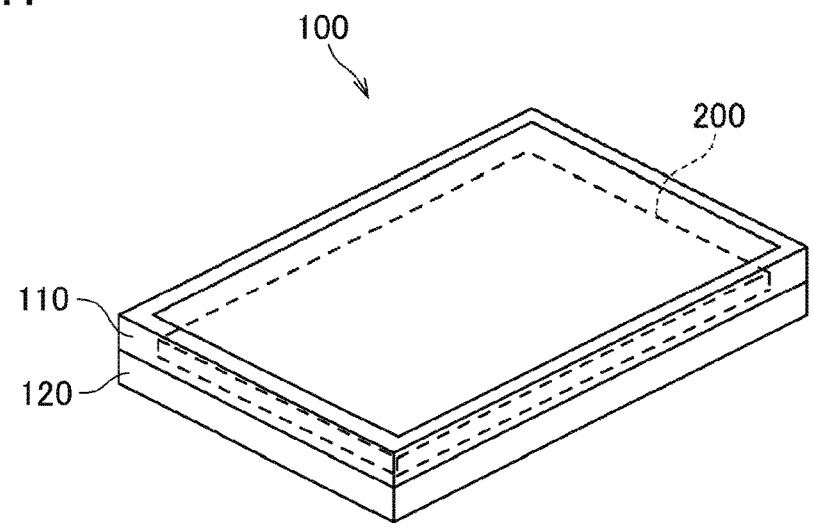
FIG. 1 is a schematic illustration of a display device according to an embodiment of the present invention.

FIG. 1 schematically illustrates a display device 100 according to an embodiment of the present invention. As illustrated in FIG. 1, the display device 100 is composed of an organic EL panel 200 fixed so as to be sandwiched by an upper frame 110 and a lower frame 120. In this embodiment, although a case of the organic EL display device is illustrated as a disclosure example, any kinds of flat panel display device, such as a liquid crystal display device, other light-emitting display devices, and electronic paper display device having electrophoretic elements, can be mentioned as other application examples. Further, needless to say, it is applicable to devices from a small/medium type to a large type with no specific limitation.

Figure 2:
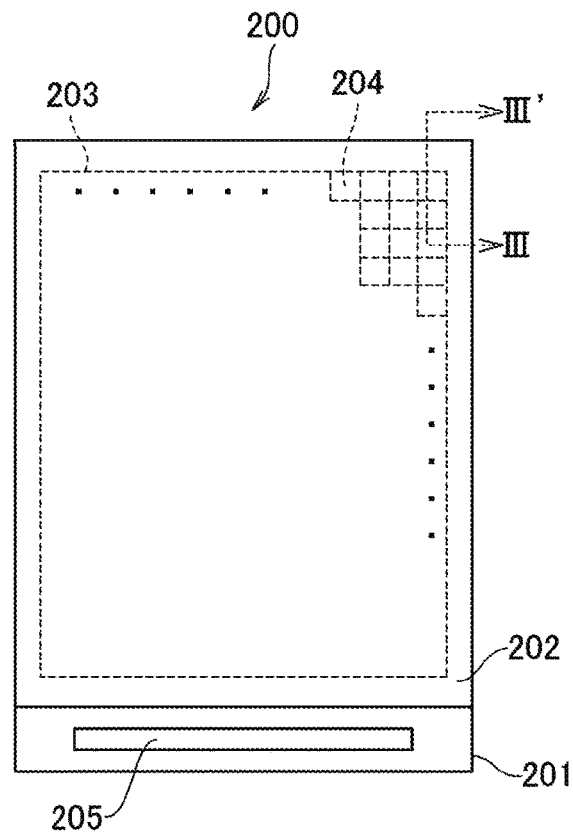
FIG. 2 is an illustration of a configuration of an organic EL panel seen from a display side.

FIG. 2 illustrates the configuration of the organic EL panel 200 of FIG. 1. The organic EL panel 200 has two substrates, which are the array substrates 201 and the color filter substrates 202, and these substrates are bonded to each other by a bonding layer described later.

The array substrate 201 has pixels 204 arranged in a matrix in a display region 203. Specifically, for example, one pixel 204 is formed by combining three or four subpixels that emit lights of wavelength regions different from one another. The array substrate 201 has a driving IC (Integrated Circuit) 205 that drives each transistor disposed in each subpixel. Specifically, for example, the driving IC 205 applies an electric potential to electrically connect a source and a drain to a scanning signal line of a pixel transistor disposed in each of the subpixels, and at the same time applies an electric potential that corresponds to a gradation value of the subpixels to a data signal line of the transistor of each of the pixels.

Figure 3:
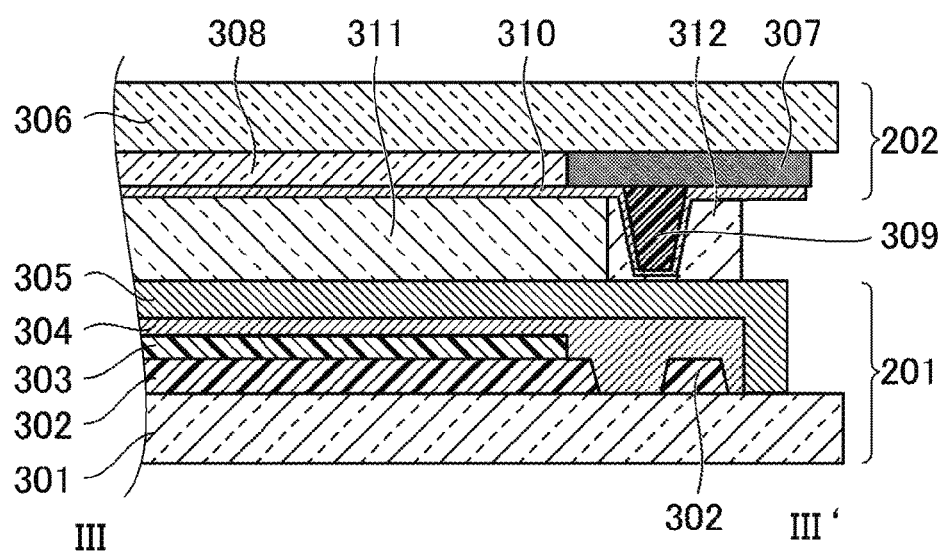
FIG. 3 is an example schematically illustrating a laminated structure of a cross section of the line III-III' in FIG. 2.

FIG. 3 schematically illustrates the cross section of a frame part of the organic EL panel 200 at the line III-III' in FIG. 2. As illustrated in FIG. 3, the array substrate 201 includes a lower glass substrate 301 that is an insulation substrate, a resin layer 302, an organic EL (Electro Luminescence) layer 303, a cathode electrode layer 304, and a barrier film 305. The barrier film 305 is disposed to cover the organic EL layer 303 and the cathode electrode layer 304 in order to protect the organic EL layer 303 and the cathode electrode layer 304. Although the organic EL layer 303 includes layers necessary to emit light as the organic EL element, such as an anode electrode layer, a hole injection layer, an electron transport layer, those are the same as the conventional technology, and thus their explanation will be omitted here.

Further, an upper glass substrate 306 that is an insulation substrate is disposed on the color filter substrate. On the upper glass substrate 306, a BM (Black Matrix) layer 307 that shields light emitted from the array substrate 201, a color filter layer 308 that transmits light of a certain wavelength, a spacer 309 that holds a cell gap between the array substrate 201 and the color filter substrate 202, and an inorganic film 310 are arranged in order toward the side of the array substrate 201. Here, the color filter layer 308 is disposed in a transmission region of each of the subpixels disposed in the display region, and the BM layer 307 is disposed in a non-transmission region of each of the subpixels and in the frame part outside of the display region 203. Further, the spacer 309 is formed on the upper part of the BM layer 307 so as to surround the display region 203. The inorganic film 310 is formed by an inorganic material such as ITO so as to cover the BM layer 307, the spacer 309, and the color filter 308.

Further, the bonding layer made of an organic material is disposed inside the spacer 309, and bonds the array substrate 201 and the color filter substrate 202 to each other. Here, the bonding layer includes the fill agent 311 that bonds the array substrate 201 and the color filter substrate 202 to each other and the dam agent 312 that is less permeable than the fill agent 311 and is disposed outwardly from the fill agent 311. Further, the fill agent 311 has a function as a filler that fills the space between the color filter substrate 202 and the array substrate 201.

Although the inorganic film 310 illustrated in FIG. 3 is disposed so as to cover all of the BM layer 307, the spacer 309, and the color filter 308, it is sufficient if the inorganic film 310 is disposed so as to be extended to at least a part of an inner side surface of the spacer 309. Further, although the dam agent 312 is disposed so as to cover the spacer 309, it is sufficient if the dam agent 312 is disposed so as to cover at least a part of the top of the spacer 309. An embodiment of such a case is described later.

[The First Embodiment of the Method of Manufacturing the Color Filter Substrate]

Figure 4A:
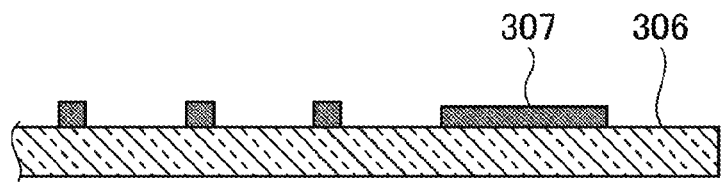
FIGS. 4A-4D are examples illustrating the first embodiment of a method of manufacturing a color filter substrate.

Subsequently, a method of manufacturing the color filter substrate 202 described above is explained. FIGS. 4A-4D illustrate a manufacturing process of the color filter substrate 202 according to the first embodiment of the present invention. Firstly, as illustrated in FIG. 4A, the BM layer 307 is formed on the upper glass substrate 306. Since the method to form the BM layer 307 uses the conventional techniques, an explanation thereof is omitted here.

Figure 4B:
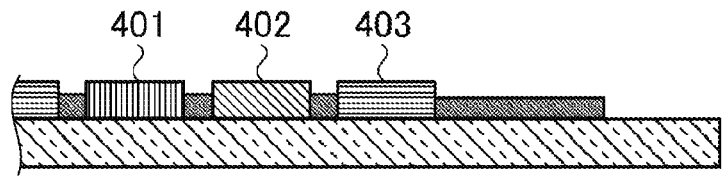

Next, as illustrated in FIG. 4B, the color filter layer 308 is formed in a region where the BM layer 307 is not disposed. Specifically, for example, the color filter layer 308 is formed by patterning a color filter material which has a light-sensitivity with a photolithography method including an exposure process and a developing process. FIG. 4B illustrates the case where the color filter layer 308 includes a red CF layer 401 (below, a color filter layer of each color is referred to as a CF layer) that transmits red light, a green CF layer 402 that transmits green light, and a blue CF layer 403 that transmits blue light, although the color filter layer 308 may include a color filter layer of a color other than red, green and blue. Further, a method to form the color filter layer 308 is not limited to the above one, and the color filter layer 308 may be formed using a conventional technology such as the ink-jet method.

Figure 4C:
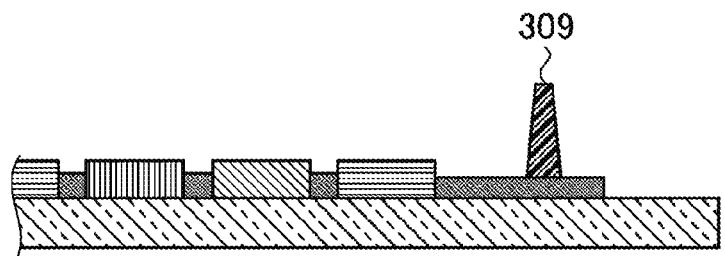

Next, as illustrated in FIG. 4C, the spacer 309 is formed so as to surround the display region 203. Specifically, for example, the spacer 309 is formed on the BM layer 307 by the photolithography method as described above. Being formed by the photolithography method, the spacer 309 can be formed with a precision higher than the fill agent 311 and the dam agent 312 described later.

Figure 4D:
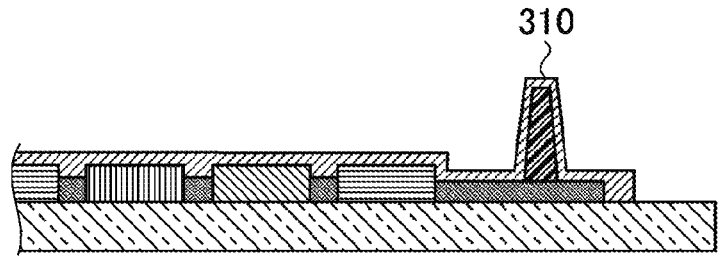

Lastly, as illustrated in FIG. 4D, the inorganic film 310 is formed so as to cover the BM layer 307, the color filter 308, and the spacer 309. Specifically, for example, as for the inorganic film 310, a transparent inorganic material such as ITO (Indium Tin Oxide) is deposited all over the upper glass substrate 306 by the sputtering method or the like. Then, using the photolithography method, a region outside the BM layer 307 formed on the frame part is removed by etching to form the inorganic film 310. Here, it is sufficient that the inorganic film 310 is formed so as to at least cover the top and the outer side surface of the spacer 309.

Figure 5:
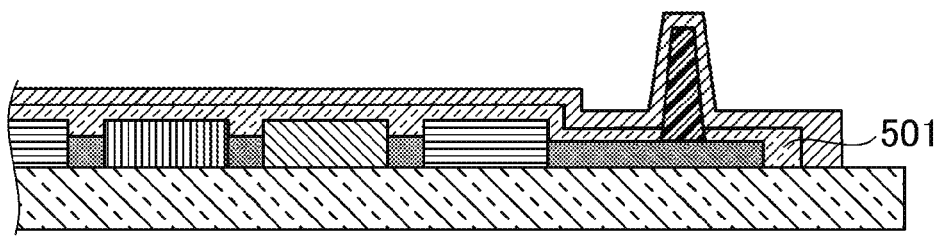
FIG. 5 is another example of the first embodiment.

In this embodiment, as illustrated in FIG. 5, an overcoat 501 may be disposed between the BM layer 307 and the color filter 308, and the inorganic film 310. Specifically, after the process of FIG. 4B and before the spacer 309 is formed, the overcoat 501 may be formed so as to cover the BM layer 307 and the color filter layer 308. In this case, the BM layer 307 and the color filter layer 308, the overcoat 501, the spacer 309, and the inorganic film 310 are formed in order on the upper glass substrate 306.

[The Second Embodiment of the Method of Manufacturing the Color Filter Substrate]

For the above first embodiment, the case where the inorganic film 310 is formed so as to cover the BM layer 307, the color filter layer 308 and the spacer 309 is explained, although it is sufficient if the inorganic film 310 is formed so as to at least cover the top and the outer side surface of the spacer 309. A method of manufacturing the color filter substrate 202 according to the second embodiment of the present invention is explained with reference to FIGS. 6A-6D.

Figure 6A:
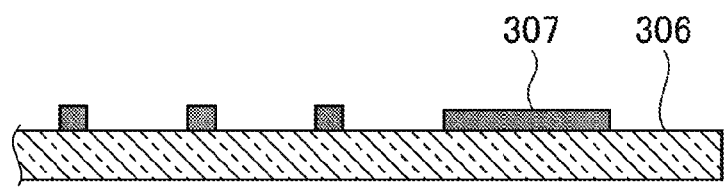
FIGS. 6A-6D are examples illustrating the second embodiment of the method of manufacturing the color filter substrate.
Figure 6B:
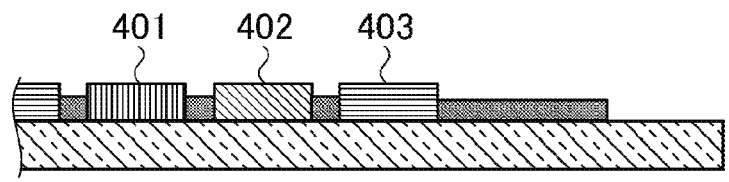
Figure 6C:
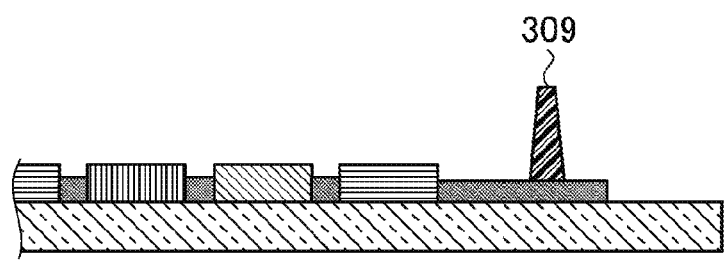

FIGS. 6A-6D illustrate a manufacturing process of the color filter substrate 202 according to the second embodiment of the method of manufacturing the color filter substrate 202. In the process of FIGS. 6A-6C, the BM layer 307, the color filter layer 308, and the spacer 309 are formed on the upper glass substrate 306. The process of FIGS. 6A-6C is carried out in the same way as that of FIGS. 4 A-4C.

Figure 6D:
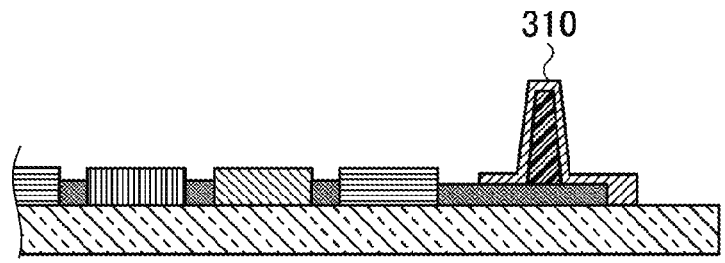

Subsequently, as illustrated in FIG. 6D, the inorganic film 310 is formed so as to cover the spacer 309 and the edge of the BM layer 307 disposed in the vicinity of the spacer 309. For example, the inorganic film 310 composed of an inorganic material is deposited all over the upper glass substrate 306 by the sputtering method or the like. Then, using the photolithography method, the inorganic film 310 deposited in regions other than the spacer 309 and the vicinity of the spacer 309 is removed by etching. With the configuration in which the inorganic film 310 is not provided in the display region as described above, a material having no transmissivity can be used as a material of the inorganic film 310 in this embodiment.

Figure 7:
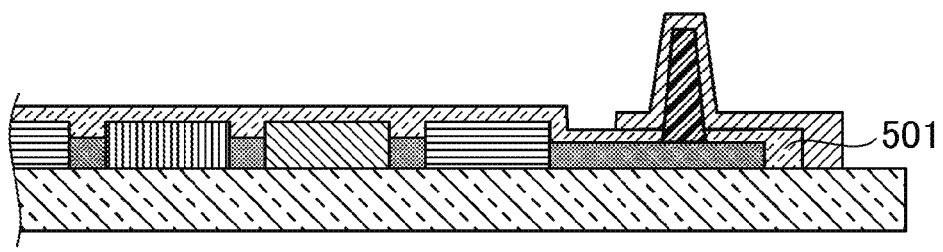
FIG. 7 is another example of the second embodiment.

Although the embodiment in which the overcoat 501 is not provided is explained in the above, similarly to the first embodiment and as shown in FIG. 7, the overcoat 501 may be provided on the BM layer 307 and the color filter layer 308, and the inorganic film 310 may be formed on the overcoat 501.

[The Third Embodiment of the Method of Manufacturing the Color Filter Substrate]

Regarding the above first and second embodiments, the case where the spacer 309 is formed with a resin material is explained, although the spacer 309 may be formed of the same material as the color filter layer 308. The method of manufacturing the color filter substrate 202 in such a case is explained with reference to FIGS. 8A-8C.

Figure 8A:
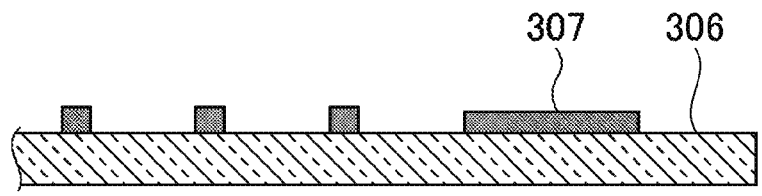
FIGS. 8A-8C are examples illustrating the third embodiment of the method of manufacturing the color filter substrate.
Figure 8B:
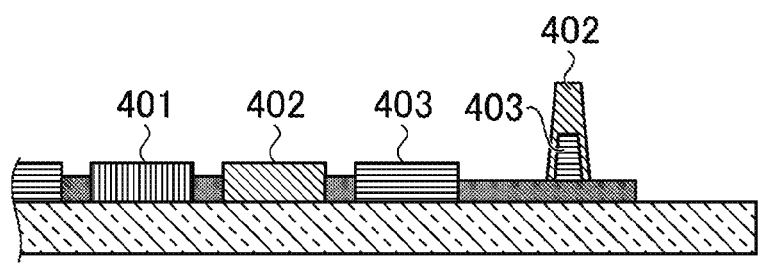
Figure 8C:
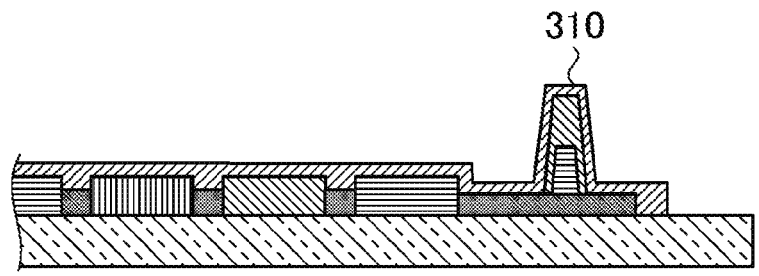

FIGS. 8A-8C illustrate a manufacturing process of the color filter substrate 202 according to the third embodiment of the method of manufacturing the color filter substrate 202. Firstly, as illustrated in FIG. 8A, the BM layer 307 is formed on the upper glass substrate 306. The method to form the BM layer 307 is the same as that of the above first and the second embodiments.

Subsequently, as illustrated in FIG. 8B, the spacer 309 is formed together with the color filter layer 308. Specifically, for example, the blue CF layer 403 is first formed in the transmission region of the blue subpixel and in the region where the spacer 309 is disposed. Here, the blue CF layer 403 in the transmission region of the blue subpixel and the blue CF layer 403 of the lower half of the spacer 309 are formed in one process by associating a pattern of an opening part and a light shielding part of an exposure mask used when the blue CF layer 403 is formed with a pattern of the transmission region of the blue subpixel and the region where the spacer 309 is disposed.

Next, the green CF layer 402 is formed in the transmission region of the green subpixel, and is also formed cumulatively on the blue CF layer 403 disposed in the region where the spacer 309 is disposed. Similarly to the description above, a pattern of the opening part and the light shielding part of the exposure mask used when the green CF layer 402 is formed is associated with a pattern of the transmission region of the green subpixel and the region where the spacer 309 is disposed, and thereby the green CF layer 402 in the transmission region of the green subpixel and the green CF layer 402 of the upper half of the spacer 309 are formed in one process. Then, with a formation of the red CF layer 401 in the transmission region of the red subpixel, the color filter layer 308 and the spacer 309 are formed.

In FIG. 8B, the green CF layer 402 and the blue CF layer 403 formed as the spacer 309 have the same center position, although they may be formed with their center positions shifted from each other as long as the CF layer arranged on the upper side covers the CF layer arranged on the lower side.

Then, as illustrated in FIG. 8C, the inorganic film 310 is formed so as to cover the BM layer 307, the color filter layer 308, and the spacer 309 formed with the same material as that of the color filter layer 308. As described above, by forming the color filter layer 308 and the spacer 309 in the same process, the load of the process can be reduced as compared with the above first and the second embodiments.

In the above, the case where the lower half of the spacer 309 is formed with the blue CF layer 403 and the upper half of the spacer 309 is formed with the green CF layer 402, although an embodiment of the present invention is not limited to such a case. For example, the spacer 309 may be formed of a combination other than that of the blue CF layer 403 and the green CF layer 402, or formed of a color filter layer of three colors or more.

Further, the thickness of the color filter layer disposed in the transmission region of the subpixel and the thickness of the color filter layer of the same color disposed as a part of the spacer 309 may be the same or different from each other. Specifically, for example, a pattern of color filter layers with different heights can be formed in the same process by using a half tone mask as the exposure mask used when the color filter layer is formed. The height of the spacer 309 and a number of colors of the color filter layer used for the spacer 309 can be adjusted by differentiating the thickness of the color filter layer disposed in the transmission region and the thickness of the color filter layer of the same color disposed as a part of the spacer 309.

Figure 9:
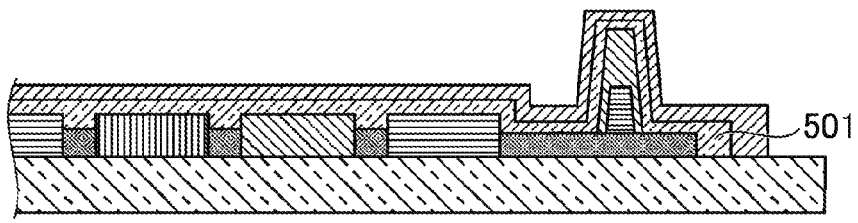
FIG. 9 is another example of the third embodiment.

Further, similarly to the above first and second embodiments and as illustrated in FIG. 9, the overcoat 501 may be provided on the BM layer 307 and the color filter layer 308, and the inorganic film 310 may be formed on the overcoat 501.

Subsequently, a method to bond the color filter substrate 202 and the array substrate 201 with each other is explained. Although a process of manufacturing the color filter substrate 202 as explained above and a process of manufacturing the array substrate 201 on which the display element is arranged in the display region are provided before bonding the color filter substrate 202 and the array substrate 201 with each other, the method of manufacturing the array substrate 201 is the same as the conventional techniques, and therefore its explanation is omitted here. All of FIGS. 10-12 illustrate respective processes to bond the color filter substrate 202 and the array substrate 201 with each other. For a brief explanation, an illustration of the color filter layer of each color on the color filter substrate 202, the resin layer 302 and the like is omitted in each figure.

Figure 10A:
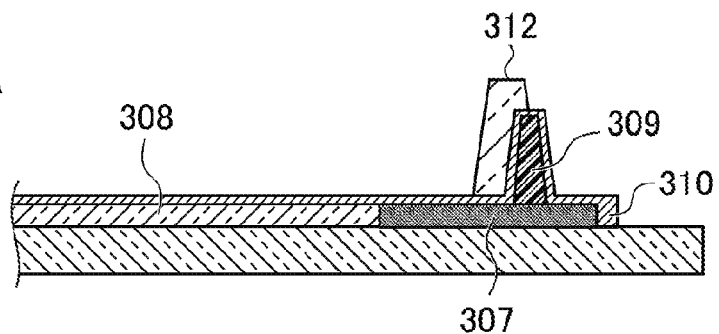
FIGS. 10A-10B are illustrations of respective processes to bond the color filter substrate and an array substrate with each other.

Firstly, as illustrated in FIG. 10A, the dam agent 312 is dropped on the color filter substrate 202. Specifically, for example, the dam agent 312 made of an organic material is dropped with use of a dispenser so as to be partially overlapped with the spacer 309. Here, the dam agent 312 uses a material that bonds the color filter substrate 202 and the array substrate 201 with each other and has a lower permeability as compared with the fill agent 311 described later. In the conventional technology, a gap holding material that holds a gap between the color filter substrate 202 and the array substrate 201 has been usually kneaded in the dam agent 312. In the present invention, the gap holding material may not be knead, because the spacer 309 is formed on the color filter substrate 202.

Figure 10B:
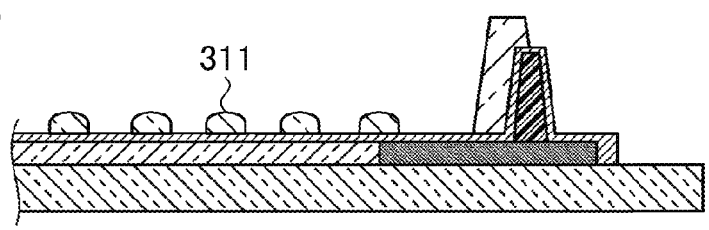

Next, as illustrated in FIG. 10B, the fill agent 311 is dropped on the color filter substrate 202. Specifically, for example, the fill agent 311 made of an organic material is dropped onto a region inside the dam agent with use of the dispenser at a predetermined interval. Here, the fill agent 311 uses a material that fills the gap between the color filter substrate 202 and the array substrate 201 to bond the two substrates with each other.

Figure 11A:
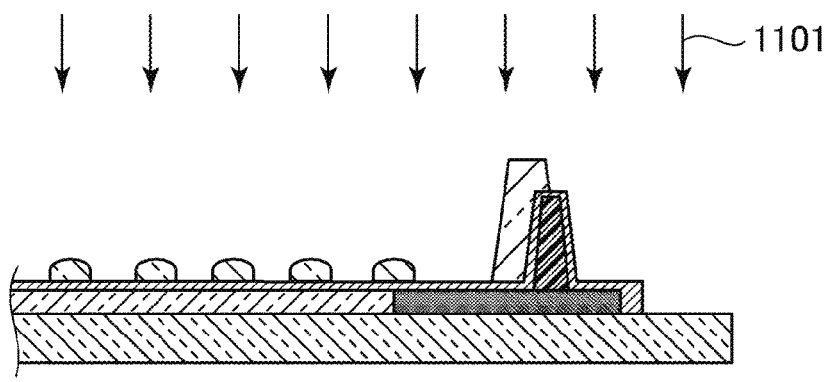
FIGS. 11A-11B are illustrations of respective processes to bond the color filter substrate and the array substrate with each other.

Subsequently, as illustrated in FIG. 11A, UV (Ultra Violet) light is radiated onto the dam agent 312 and the fill agent 311 respectively dropped on the color filter substrate 202. Note that it is desirable for both the dam agent 312 and the fill agent 311 to use a delayed curing type resin that gradually cures after radiating UV (Ultra Violet) light and completes the cure after bonding the color filter substrate 202 and the array substrate 201 to each other.

Figure 11B:
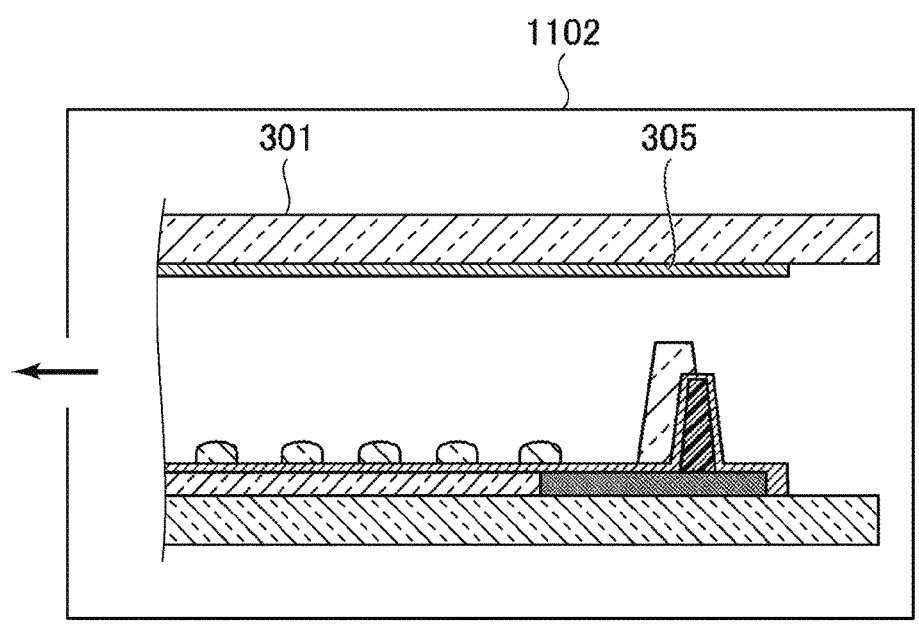

Next, as illustrated in FIG. 11B, the color filter substrate 202 on which the dam agent 312 and the fill agent 311 are dropped and the array substrate 201 are set in a vacuum chamber 1102. Then, the inside of the vacuum chamber 1102 is in a vacuum state by exhausting air inside the vacuum chamber 1102 to the outside. To be in the "vacuum state" referred to here, it is sufficient to be in a degree of vacuum high enough that the substrates are pushed with each other by an atmospheric pressure and the fill agent 311 disposed between the substrates are uniformly filled between them when the color filter substrate 202 and the array substrate 201 that are bonded to each other are taken out from the vacuum chamber 1102. For example, it is sufficient if the pressure inside the vacuum chamber 1102 is around 0.1 Pa.

Figure 12A:
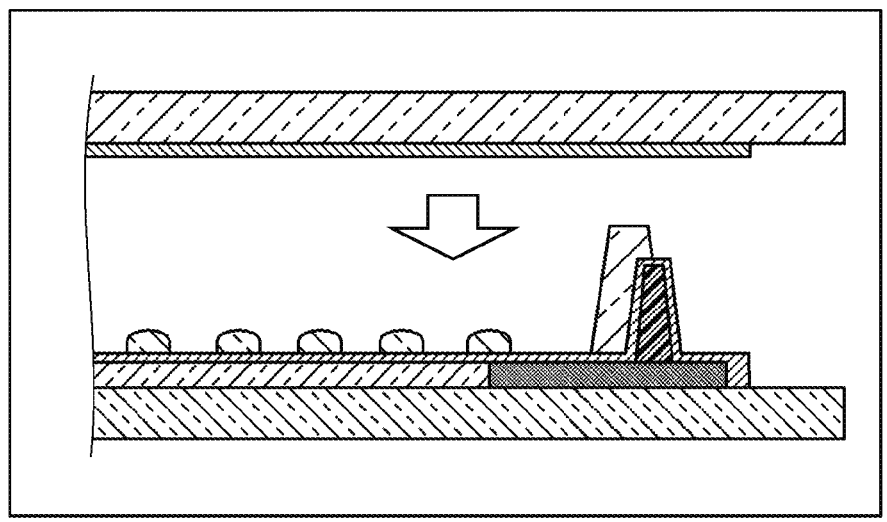
FIGS. 12A-12B are illustrations of respective processes to bond the color filter substrate and the array substrate with each other.

Subsequently, as illustrated in FIG. 12A, the color filter substrate 202 and the array substrate 201 arranged opposed to the color filter substrate 202 are aligned and bonded to each other. Since the method of the alignment is the same as the conventional techniques, the explanation thereof is omitted here.

Figure 12B:
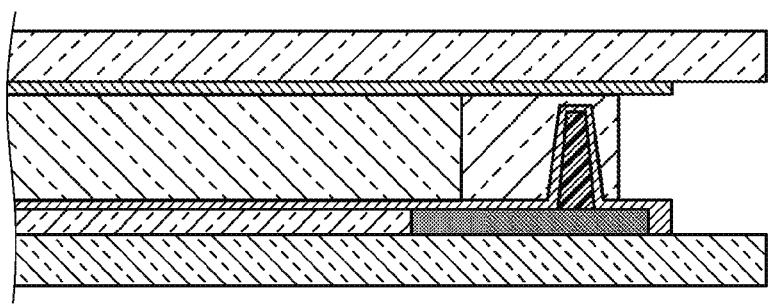

Lastly, as illustrated in FIG. 12B, the color filter substrate 202 and the array substrate 201 that are bonded to each other are taken out from the vacuum chamber 1102. At this time, the color filter substrate 202 and the array substrate 201 are pushed by the atmospheric pressure. This makes the fill agent 311 disposed between the substrates fill the display region, and the dam agent 312 be disposed to cover the top, the outer side surface, and the inner side surface of the spacer 309 so that the fill agent 311 does not pass beyond the spacer 309. Then, after a certain amount of time further passes, by the UV light 1101 which has already been radiated the fill agent 311 and the dam agent 312 are cured, and the organic EL panel 200 is complete as illustrated in FIG. 3.

As described above, the top, the outer side surface, and the inner side surface of the spacer 309 are covered by the inorganic film 310 having a low permeability, and thereby the route through which moisture penetrates into the organic EL layer 303 from the lateral side of the organic EL panel 200 via the dam agent 312 and the fill agent 311 is blocked and the degeneration of the organic EL layer 303 can be prevented.

Figure 13A:
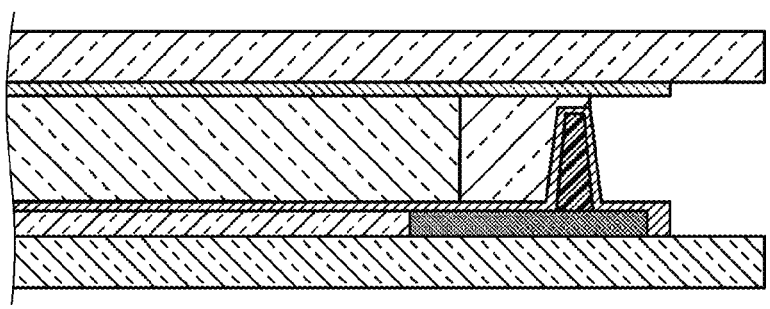
FIGS. 13A-13B are illustrations for explaining a position to dispose a dam agent.

Although it is desirable that the inorganic film 310 disposed at the top of the spacer 309 and the array substrate 201 are in contact with each other, they need not be in contact with each other. For example, as illustrated in FIG. 13A, even in the case where the dam agent 312 is disposed between the top of the spacer 309 and the array substrate 201, the top of the spacer 309 and the array substrate 201 may not be in contact with each other because a large part of the route through which moisture penetrate into the organic EL layer 303 can be blocked by the inorganic film 310. Further, in the above, although the case where the fill agent 311 and the dam agent 312 are dropped on the color filter substrate 202 is explained, the fill agent 311 and the dam agent 312 may be dropped on the array substrate.

Further, in the above, the case is explained in which as a result of the process of FIG. 10A where the dam agent 312 is disposed so as to be overlapped with the spacer 309, as illustrated in FIG. 12B, the dam agent 312 is formed so as to cover the top, the outer side surface, and the inner side surface of the spacer 309. However, while the spacer 309 is disposed mainly by a method with a high position precision, such as the photolithography method, the dam agent 312 is disposed mainly by a method having a relatively low position precision, such as dropping with the dispenser. Thus, the relative positional relationship between the dam agent 312 and the spacer 309 may be different from the arrangement relationship shown in FIG. 12B, but it is sufficient if the dam agent 312 is at least disposed on the top of the spacer 309 or disposed outwardly from the top.

Figure 13B:
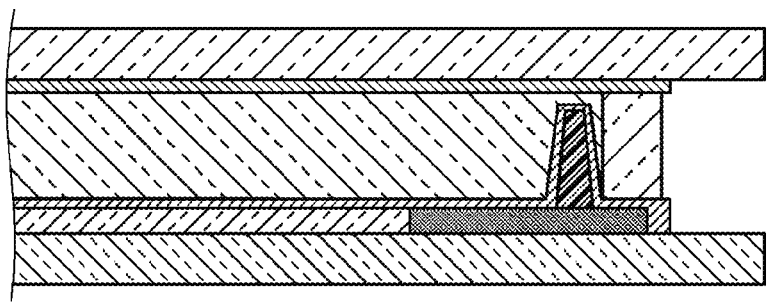

Specifically, for example, as illustrated in FIG. 13A, the dam agent 312 may be formed so as to cover only the top and the inner side surface of the spacer 309. Further, for example, as illustrated in FIG. 13B, the fill agent 311 may cover the top, the outer side surface, and the inner side surface of the spacer 309, and the dam agent 312 may be formed outwardly from this fill agent 311. Even in such a configuration, the degeneration of the organic EL layer 303 can be reduced by blocking the route through which moisture penetrates into the organic EL layer 303 from the lateral side of the organic EL panel 200 via the dam agent 312 and the fill agent 311.

[Variation]

For the above embodiment, although the case where one spacer 309 is disposed so as to surround the periphery of the display region is explained, two, three or more spacers 309 may be formed as well extending outwardly from the display region.

Figure 14A:
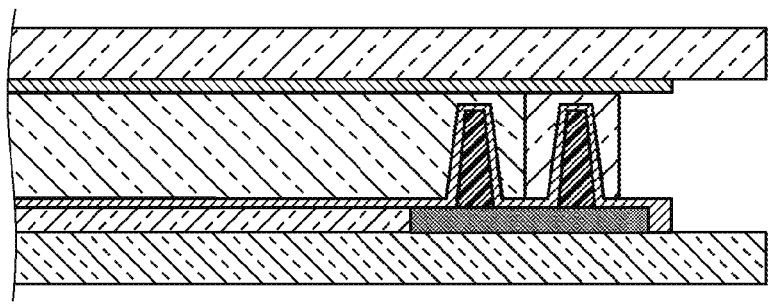
FIGS. 14A-14C are illustrations for explaining a laminated structure of a cross section in a case where two spacers are disposed so as to surround a periphery of a display region.

Specifically, for example, as illustrated in FIG. 14A, two spacers 309 may be disposed so as to surround the periphery of the display region 203. According to this configuration, the route through which moisture penetrates into the organic EL layer 303 from the lateral side of the organic EL panel 200 via the dam agent 312 and the fill agent 311 is blocked twice by the inorganic film 310 disposed on the two spacers 309, and the degeneration of the organic EL layer 303 can be further reduced. In this case as well, although it is desirable that the dam agent 312 is formed so as to cover the top, the inner side surface, and the outer side surface of the outer spacer 309 in the positional relationship between the dam agent 312 and the spacer 309, it is sufficient if the dam agent 312 is at least disposed on the top of the outer spacer 309 or disposed outwardly from the top.

Figure 14B:
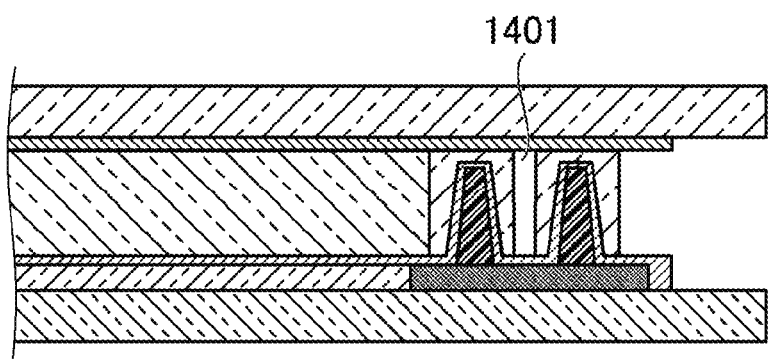
Figure 14C:
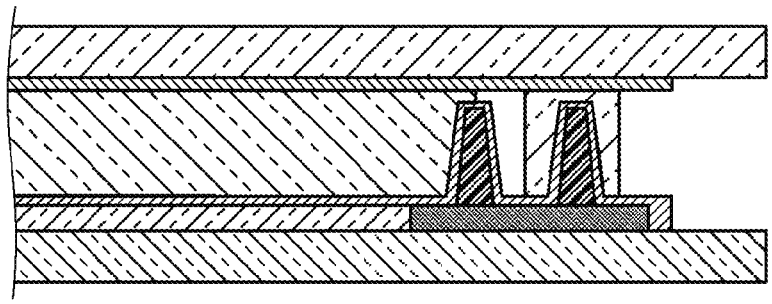
Figure 16:
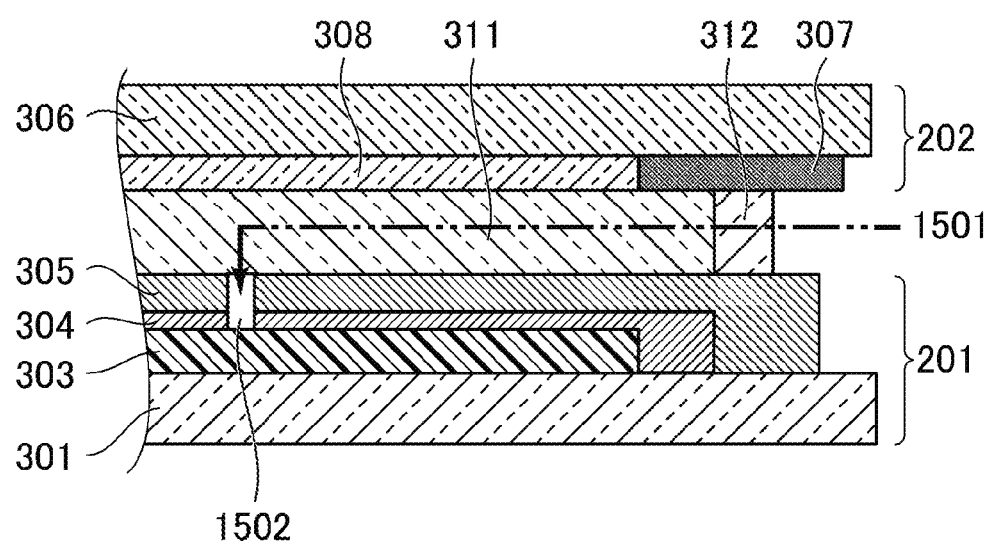
FIG. 16 is an illustration for explaining a moisture penetration route in a conventional technology.

Further, a vacuum layer 1401 may be provided between the two, three or more spacers 309. Specifically, for example, as illustrated in FIGS. 14B and 14C, the vacuum layer 1401 may be provided between the two spacers 309. The moisture penetrating into the organic EL layer 303 via the dam agent 312 can be further reduced by providing the vacuum layer 1401. In the case where two spacers 309 are formed, it is sufficient if the dam agent 312 is disposed on the top of the outer spacer 309 or outwardly from the outer spacer 309, and as illustrated in FIGS. 14A and 14C, the dam agent 312 may not be disposed around the inner spacer 309.

Those skilled in the art can readily arrive at variations and modifications of various types within the spirit of the present invention. It is understood that all such variations and modifications are within the scope of the present invention. For example, additions, deletions, or design variations of components or additions, omissions, or condition variations of processes appropriately made by those skilled in the art in regard to the embodiments described above are within the scope of the present invention to the extent that the purport of the present invention is included.

What is claimed is:

1. An organic EL display device provided with a display region composed of a plurality of pixels, comprising:
    a first substrate including at least one spacer that is formed so as to surround the display region, and an inorganic film that is formed of an inorganic material and covers at least a top and an outer side surface of the at least one spacer;
    a second substrate including an organic EL layer that emits light, a cathode electrode layer that is disposed on the first substrate side of the organic EL layer, and a barrier film that is in contact with the cathode electrode layer on the first substrate side of the cathode electrode layer and covers the cathode electrode layer, the second substrate being disposed opposed to the first substrate; and
    a bonding layer that is disposed inside the at least one spacer, bonds the first substrate and the second substrate with each other, and is made of an organic material, wherein
    the inorganic film that covers at least the top and the outer side surface of the at least one spacer is in contact with the barrier film.

2. The display device according to claim 1, wherein the inorganic film extends further to at least a part of an inner side surface of the at least one spacer.

3. The display device according to claim 1, wherein the bonding layer has a fill agent that fills a space between the first substrate and the second substrate, and a dam agent that is less permeable than the fill agent and is disposed outwardly from the fill agent, and
    wherein the dam agent is disposed so as to cover at least a part of a top of the at least one spacer.

4. The display device according to claim 1, wherein the at least one spacer comprises two or more spacers formed extending outwardly from the display region.

5. The display device according to claim 4, wherein a vacuum layer is provided between the two or more spacers.

6. The display device according to claim 1, wherein the first substrate further has a color filter layer that transmits light of a predetermined wavelength, and the at least one spacer is formed of a same material as the color filter layer.

* * * * *